United States Patent [19]

Washizuka et al.

[11] Patent Number: 4,539,067
[45] Date of Patent: Sep. 3, 1985

[54] METHOD AND APPARATUS FOR MANUFACTURING SINGLE CRYSTALS

[75] Inventors: Syoichi Washizuka; Jisaburo Ushizawa, both of Yokohama; Yoshihiro Kokubun, Tokyo; Tsuguo Fukuda, Yokohama, all of Japan

[73] Assignee: Tokyo Shibaura Denki Kabushiki Kaisha, Kawasaki, Japan

[21] Appl. No.: 508,091

[22] Filed: Jun. 27, 1983

Related U.S. Application Data

[62] Division of Ser. No. 336,708, Jan. 4, 1982, Pat. No. 4,397,813.

[30] Foreign Application Priority Data

Jan. 17, 1981 [JP] Japan .................................. 56-4596

[51] Int. Cl.³ ............................................ C30B 15/28
[52] U.S. Cl. .................................................... 156/601
[58] Field of Search .................. 156/601, 607, 617 SP; 422/109, 249

[56] References Cited

U.S. PATENT DOCUMENTS

| | | | |
|---|---|---|---|
| 3,934,983 | 1/1976 | Bardsley et al. | 156/617 SP |
| 4,008,387 | 2/1977 | Green et al. | 422/249 |
| 4,207,293 | 6/1980 | Scholl et al. | 422/249 |
| 4,258,003 | 3/1981 | Hurle et al. | 422/109 |
| 4,397,813 | 8/1983 | Washizuka et al. | 422/109 |

FOREIGN PATENT DOCUMENTS

| | | |
|---|---|---|
| 2752308 | 5/1978 | Fed. Rep. of Germany ...... 156/617 SP |
| 131683 | 10/1975 | Japan . |
| 1478192 | 6/1977 | United Kingdom . |
| 1494342 | 12/1977 | United Kingdom . |

OTHER PUBLICATIONS

Bardsley et al., Slot Crystal Growth 24/25 1974, pp. 369–373.

Primary Examiner—Hiram H. Bernstein
Attorney, Agent, or Firm—Oblon, Fisher, Spivak, McClelland & Maier

[57] ABSTRACT

The invention provides a method and an apparatus for manufacturing single crystals wherein the weight of the single crystal pulled is measured by a weight detector. The measured weight is compared with a reference weight signal which is generated from a reference weight signal generator. A weight deviation signal representing a difference between these two signals is generated by a weight deviation detector. The weight deviation signal is differentiated by a first differentiation circuit and a differentiation output signal obtained is corrected for compensation for the buoyancy of the liquid encapsulant by a signal which is generated by a buoyancy correction signal generator. A corrected signal thus obtained is differentiated by a second differentiation circuit and is thereafter added to the corrected signal. The addition result is phase-compensated by a phase-compensating circuit. The phase-compensated signal is supplied to a heating control circuit. At the same time, the heating control circuit generates a heating control signal to a heating device in response to a program signal which is generated from a program signal generator. In response to the output signal from the heating device, a heater which controls the temperature of the melt held in a vessel and which is arranged outside the vessel is heated according to the program.

4 Claims, 10 Drawing Figures

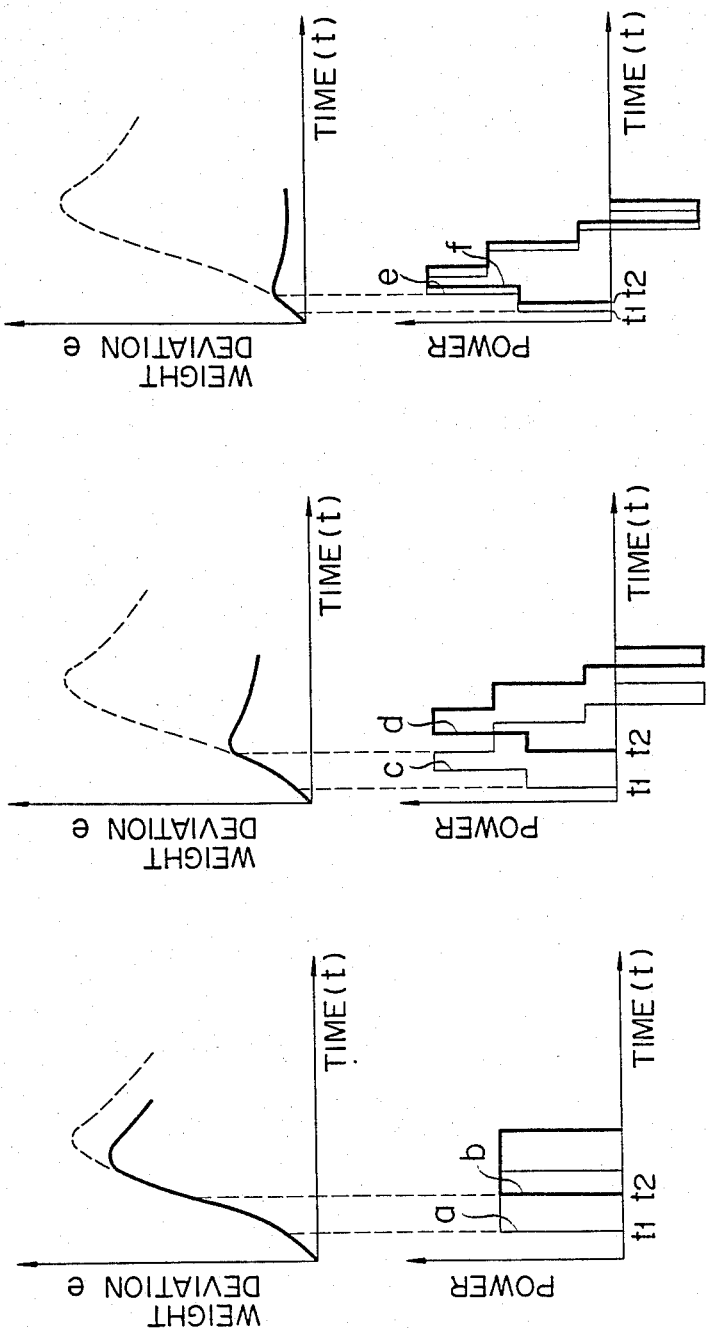

METHOD AND APPARATUS FOR MANUFACTURING SINGLE CRYSTALS

This is a division of application Ser. No. 336,708, filed Jan. 4, 1982 now U.S. Pat. No. 4,397,813 issued Aug. 9, 1983.

BACKGROUND OF THE INVENTION

1. Field of the Invention

The present invention relates to a method and an apparatus for manufacturing single crystals. More particularly, it relates to a method and an apparatus for manufacturing crystal by a weighing method wherein group III-V compound semiconductor single crystals of constant diameter are manufactured by the resistance-heated system.

2. Description of the Prior Art

In the conventional method for manufacturing the group III-V compound semiconductor single crystals, for example, GaP, GaAs, GaSb or InP, pulling from a melt is performed according to the Czochralski method, particularly, the Liquid Encapsulated Czochralski method (to be referred to as the LEC method for brevity hereinafter). During this procedure, various controls are performed according to fluctuations in the diameter of the obtained crystals so that the single crystals of constant diameter may be obtained. The control of fluctuations in the diameter of single crystals manufactured by pulling from a melt according to the LEC method is known to be performed by controlling the temperature of the melt. The conventional methods of heating control include the X-ray method wherein X-rays are projected on a single pulled crystal for observation of the diameter, or the weighing method wherein the weight of a single crystal during pulling is measured, so that fluctuations in the diameter of the single crystals may be corrected and single crystals of constant diameter may be manufactured. The weighing method, a particularly well-known prior art method, is disclosed in Japanese Patent Disclosure (Kokai) No. 50-131683, which corresponds to U.S. Pat. No. 4,258,003 and British Pat. No. 1,494,342 wherein the weight of a single crystal per unit length is measured during pulling from the melt in a crucible, a control circuit is operated according to fluctuations in the diameter, and power to be supplied to a work coil is controlled, so that single crystals of constant diameter may be manufactured. This weighing method is based on the fact that the measured weight of a single crystal is affected by the height of the meniscus which is formed between the crystal and the melt. According to this weighing method, the weight of this part is corrected to make the diameter of single crystals formed by pulling constant.

However, the prior art described above only shows experiments conducted for single crystals having diameters of 20 to 40 mm, and provides no teaching concerning single crystals having diameters of about 50 to 62 mm, which are most frequently used in industrial applications. It seems that some problems occur when prior art is directly applied to single crytals of larger diameters.

In the manufacture of the group III-V compound semiconductor single crystals, especially GaP single crystals, the diameter abruptly becomes small after it abruptly becomes very large. Once such a large fluctuation occurs, heating control for obtaining single crystals of constant diameter is difficult.

The phenomenon as described above is considered attributable to periodic disturbances of balance between the temperature of the crystal and temperature of the solid-liquid interface which is caused by the change in the heat conduction pattern at the solid-liquid interface when the crystal passes through the liquid encapsulant and is first brought into contact with the atmosphere during the pulling of single crystals from the melt.

When such an abrupt fluctuation in the diameter occurs, especially with a crystal having an index of plane of (100), the sectional shape changes from elliptical to square and facet growth becomes predominant.

When the temperature gradient in the axial and radial directions of the crucible holding the melt is increased in order to prevent such a great diameter fluctuation, the diameter fluctuation indeed decreases. However, the thermal stress increases, resulting in an increase in the etch pit density and cracking.

The LEC method, if used in order to manufacture the group III-V compound semiconductor signal crystals, especially GaP single crystals, cannot employ for the following reasons a known automatic diameter control device for achieving the PID control which is commonly used in crystallizing oxides or the like.

The first reason is attributable to the characteristics of the crystal growing process and resides in the fact that the change in the temperature of the melt by control of the heating device cannot catch up with an abrupt change in the diameter of the GaP crystals. An abrupt change in the diameter of the GaP crystals takes about 5 to 10 minutes. No problem occurs if the temperature of the melt changes at the same rate as this. However, in practice, the time constant of the thermal response of the melt is about 4 minutes. Even if the temperature control is performed, there is a delay of about 2 minutes until the melt temperature catches up with the fluctuation in the diameter, due to the control delay in the feedback system.

The second reason is that an abrupt increase or decrease of the diameter involves a sharp peak. Therefore, the differentiated value of the change of the diameter at this peak cannot be obtained, and the control operation thus becomes discontinuous.

The third reason is that the pulled single crystal is subject to the influence of the buoyancy of the liquid encapsulant. Accordingly, it is difficult to correctly measure the true weight of the crystal.

For the reasons described above, in some cases, the diameter of the single crystals being pulled is observed through a window formed in the furnace, and the temperature control of the heating device is manually performed according to a predetermined temperature program. However, with this manual control, correct control of the diameter may not be performed, internal distortion of the crystals increases, and single crystals of good quality may not be obtained. Therefore, an effective method for manufacturing single crystals, especially group III-V compound semiconductor single crystals, which utilizes the weighing method and which allows manufacture of single crystals of constant diameter by automatic control has not been available.

SUMMARY OF THE INVENTION

The present invention has been made in consideration of this and has for its object to provide a method and an apparatus for manufacturing single crystals of constant diameter by controlling the temperature of a melt in a crucible while measuring the weight of a single crystal being pulled.

In order to achieve the above object, there is provided according to the present invention a method for manufacturing single crystals comprising the steps of: a first step of pulling a single crystal from a melt within a vessel holding a melt and a liquid encapsulant; a second step of measuring a weight of the single crystal pulled in said first step; a third step of comparing a weight signal obtained in said second step with a reference weight signal to provide a weight deviation signal; a fourth step of differentiating the weight deviation signal obtained in said third step; a fifth step of converting a buoyancy of said liquid encapsulant influencing the single crystal pulled into a weight/time signal corresponding thereto and outputting the weight/time signal as a buoyancy correction signal; a sixth step of subtracting the buoyancy correction signal obtained in said fifth step from a differentiation output signal obtained in said fourth step to provide a signal corresponding to a true diameter fluctuation of the single crystal; a seventh step of differentiating the signal obtained in said sixth step; an eighth step of adding a differentiation output signal obtained in said seventh step and the signal obtained in said sixth step; a ninth step of phase-compensating a signal obtained in said eighth step to provide a phase-compensated signal to make a thermal response of the melt early; a tenth step of generating a heating control signal for the melt in response to the phase-compensated signal obtained in said ninth step; and an eleventh step of heating the melt in response to the heating control signal obtained in said tenth step.

Further, there is provided an apparatus for manufacturing single crystals for practicing the method of the present invention comprising:

first means for pulling a single crystal from a melt held in a vessel holding a melt and a liquid encapsulant; second means for measuring a weight of the single crystal pulled by said first means; third means for generating a reference weight signal corresponding to a reference weight of the single crystal; fourth means for generating a weight deviation signal by comparing a weight signal of the single crystal obtained from said second means with the reference weight signal obtained from said third means; fifth means for differentiating the weight deviation signal obtained from said fourth means to provide a differentiation output signal; sixth means for receiving the reference weight signal from said third means and the differentiation output signal from said fifth means, for converting a buoyancy of said liquid encapsulant influencing the single crystal pulled into a weight/time signal corresponding to the buoyancy, and for generating a buoyancy correction signal; seventh means for receiving the differentiation output signal from said fifth means and the buoyancy correction signal from said sixth means, for subtracting the buoyancy correction signal from the differentiation output signal, and for generating a signal corresponding to a true diameter fluctuation of the single crystal; eighth means for differentiating the signal from said seventh means to generate a differentiation output signal; ninth means for adding the differentiation output signal from said eighth means and the signal from said seventh means; tenth means for phase-compensating a signal obtained in said ninth step to generate a phase-compensated signal to make a thermal response of the melt early; eleventh means for receiving the phase-comprensated signal from said tenth means and generating a heating control signal for the melt; and twelfth means for heating the melt in response to the heating control signal from said eleventh means.

According to the method and apparatus for manufacturing single crystals according to the present invention, the pulled single crystals have fewer crystal defects, and distortion and cracking tend to occur less frequently. The pulling of polycrystalline or twin structures is rare, and the manufacturing yield of the single crystals is significantly improved. The pulling may be performed in any crystal axis direction. The method and apparatus of the present invention particularly facilitate automatic control in industrial applications. The fluctuations in the diameter of the single crystals manufactured may be supressed to less than $\pm 1\%$, so that single crystals of excellent quality may be manufactured.

BRIEF DESCRIPTION OF THE DRAWINGS

FIGS. 2A to 2C are graphs showing the relationships between the increase in the weight deviation of the pulled crystal and the power supplied to the heater for heating during temperature control;

DETAILED DESCRIPTION OF THE PREFERRED EMBODIMENTS

Figure 1:
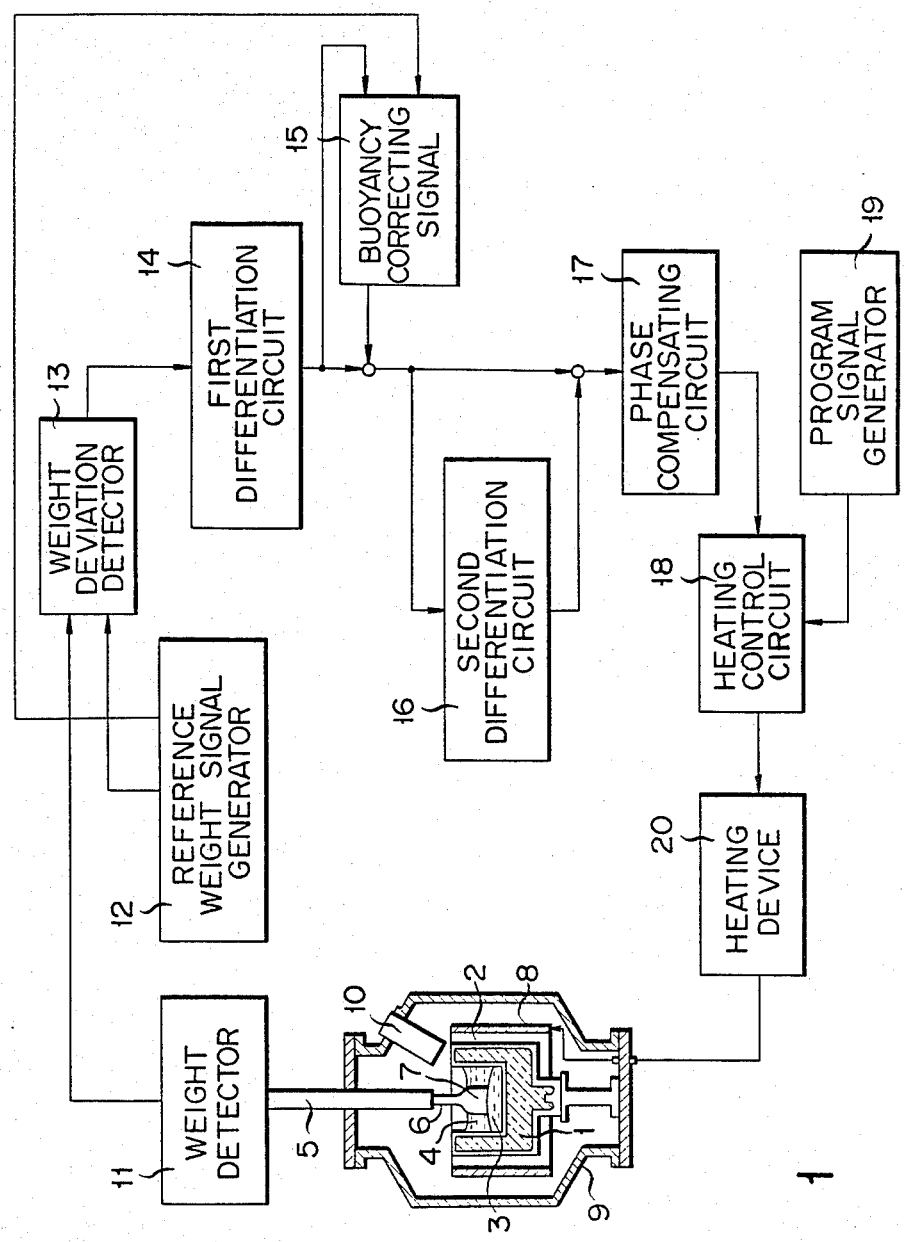
FIG. 1 is a schematic sectional view of an apparatus according to an embodiment of the present invention, and a block diagram of a control section.

The preferred embodiments of the present invention will now be described with reference to the accompanying drawings. As shown in FIG. 1, in the apparatus of the present invention, a GaP melt 3, for example, is held in a crucible 2 which is filled with an adiabatic material 1. A liquid encapsulant 4 is placed thereover. A pulling shaft 5 is arranged immediately above the opening of the crucible 2. After a seed crystal 6 is attached at the tip of the pulling shaft 5, the pulling shaft 5 is lowered to bring the seed crystal 6 into contact with the GaP melt 3 as shown in the figure and is then pulled up, thereby to obtain a GaP crystal 7. A heater 8 for heating the GaP melt 3 is arranged outside the crucible 2. The parts mentioned above are housed as an integral unit in a high pressure vessel 9. An observation window 10 is attached to part of the high pressure vessel 9, through which the pulling operation of the GaP crystal 7 may be observed. A weight detector 11 for detecting the weight of the GaP crystal in the course of the pulling operation is mounted to the upper end of the pulling shaft 5. Separate from the weight detector 11, a reference weight signal generator 12 is incorporated for generating a reference weight signal corresponding to the reference weight of the crystal. A weight signal of the GaP crystal 7 which is obtained by the weight detector 11 during the course of pulling, and the reference weight signal generated by the reference weight signal generator 12, are input to a weight deviation detector 13. The weight deviation detector 13 calculates a weight deviation and outputs a weight deviation signal to a first differentiation circuit 14. A differentiation output signal from the first differentiation circuit 14 is compared with a signal for compensating the buoyancy of the liquid encapsulant generated by a buoyancy correction signal generator 15. The effects of the buoyancy of the liquid encapsulant 4 on the GaP crystal 7 are corrected. The correction output signal representing the diameter fluctuation of the GaP crystal is further differentiated by a second differentiation circuit 16. The output signal from the second differentiation circuit 16 is added to the output signal which is corrected to compensate for the buoyancy, and the addtion result is fed to a phase compensating circuit 17. The phase compensating circuit 17 generates a phase-compensated signal as a heating control signal which shortens the response time of the melt so that the heating temperature of the melt may catch up with the fluctuations in the diameter of the GaP crystal 7. The phase-compensated signal is input to a heating control circuit 18. At this time, a program signal generator 19 generates a heating temperature program signal and the heating control circuit 18 generates a heating control signal in order to drive a heating device 20. When the heating device 20 is driven, the heater 8 in the high pressure vessel 9 is heated to increase the temperature of the melt of the GaP crystal in the crucible 2. Generation of the heating control signal for manufacturing a GaP single crystal of controlled diameter and the formation of the conventional heating control signal with the apparatus shown in FIG. 1 will be described with reference to FIGS. 2A to 2C.

If the diameter of the GaP single crystal 7 is not constant and the weight deviates from the reference weight by a weight deviation e, with the conventional device utilizing the PID control system, the increase in the weight deviation e is detected at a predetermined time t1 as shown in FIG. 2A, and the heating operation is initiated at time t1 as shown by a thin line a. However, before the temperature of the solution actually rises in practice, there is a time delay of t2−t1 due to the delay in the thermal response of the melt itself and the delay of the feedback system as described above. Therefore, the increase in the temperature of the melt indicated by a thick line b cannot follow the increase in the diameter of the crystal, and the increase in the diameter of the crystal results in an increase in the weight deviation e as indicated by a solid line. When the temperature of the melt reaches a predetermined value after the delay, the diameter of the crystal is already in the process of decreasing, resulting in incorrect control of the diameter of the crystal.

On the other hand, in the embodiments of the present invention, the output signal obtained by the primary differentiation of the weight deviation signal is corrected by the buoyancy correction signal. The obtained signal is then subjected to secondary differentiation to obtain a heating control signal upon reception of which the temperature of the melt may be controlled as indicated by a thick line d in correspondence with the heating control of the heater indicated by a thin line c shown in FIG. 2B. This heating control signal is phase-compensated by the phase compensating circuit 17 so as to reduce the difference between a thin line e and a thick line f as shown in FIG. 2C and to shorten the thermal response of the melt.

The phase compensating circuit 17 may comprise, for example, a passive circuit lag network as described in "Control System Design", C. J. Savant Jr., Ph. D., second edition, McGraw-Hill Book Company, 1964, p. 221. By subjecting the heating control signal in the feedback system to the primary differentiation, the secondary differentiation, and phase compensation, the control system may be made more responsive to correct the thermal time constant of the melt quickly and to shorten the thermal response of the melt.

The buoyancy correction signal generator 15 may be of any configuration if the adverse effects of the buoyancy of the liquid encapsulant may be substantially eliminated. The output pattern of the buoyancy correction signal generator 15 may be easily obtained by a conventional program voltage generator. For example, when a crystal having a diameter $2r(t)$ at time t1 is pulled by the LEC method, the apparent weight change, per unit time $dw'/dt$ (gr/min), considering the buoyancy of the liquid encapsulant may be expressed by:

$$dw'/dt = \pi v \rho_s r^2(t) \cdot F \tag{1}$$

when the entire crystal is in the liquid capsule. In general, the apparent weight change is expressed by $$dw'/dt = \pi v \rho_s r^2(t) \cdot F + \pi v \rho_s r^2(t-t')(1-F) \tag{2}$$

where $t'$ is a solution of $$v \int_{t'}^{t} \{R^2 - r^2(t)\}dt = H_{BO}R^2, \tag{3}$$

v is a velocity of crystal growth, $\rho_s$ is the crystal density, R is the radius of the crucible, $H_{BO}$ is the initial height of the liquid encapsulant, and F is a coefficient representing the effects of the buoyancy of the liquid encapsulant.

Figure 3A:
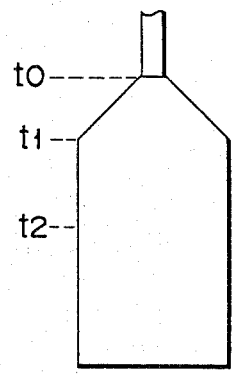
FIGS. 3A and 3B are views showing the pulling positions of the crystal, and waveforms of output signals from a buoyancy correction signal generator shown in FIG. 1, corresponding to these pulling positions.
Figure 3B:
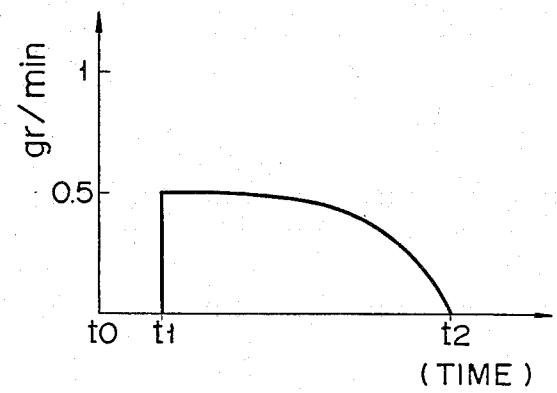

The output pattern of the buoyancy correction signal generator 15 may be obtained from equations (1), (2) and (3) according to the shape of the shoulder of the crystal, the diameter of the crystal, the length of the crystal, the diameter of the crucible and so on. This output pattern may be obtained experimentally or by simulation. In the embodiment of the present invention, when the shape of the GaP crystal is as shown, for example, in FIG. 3A, and times t0, t1 and t2 are times during the course of pulling, the output pattern of the buoyancy correction signal generator 15 may be obtained as that shown in FIG. 3B considering the buoyancy of the liquid encapsulant.

The present invention has been described with reference to general embodiments thereof. However, concrete examples for manufacturing single crystals using the apparatus of the present invention will now be described.

A description will be made of a case of manufacturing a (100) GaP single crystal.

Figure 4:
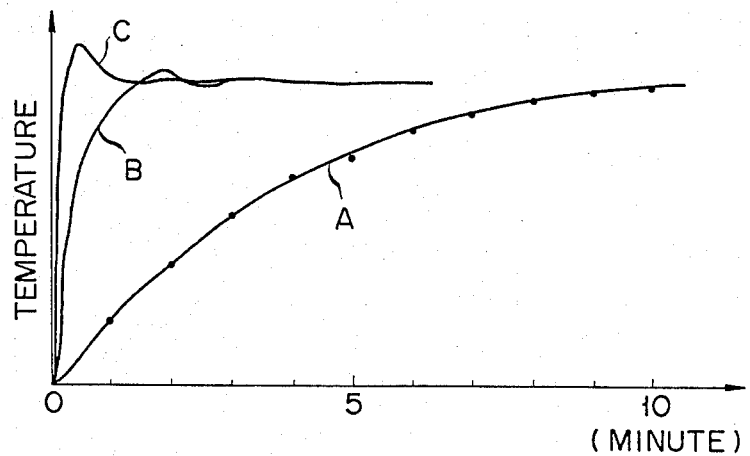
FIG. 4 is a graph showing the relationship between solution temperature and time, for explaining the effects of the thermal response of the melt on a heating control signal which has been phase-compensated.

The crucible 2 had an inner diameter of 96 mm. As a raw material, 600 g of GaP were charged in the crucible 2. A liquid encapsulant $B_2O_3$ of 180 g weight was placed over the crucible. The interior of the high pressure vessel 9 was pressurized by nitrogen gas at a pressure of 60 kg/cm² to melt the raw material to prepare the GaP melt 3. The seed crystal 6 having an index of plane of (100) was brought into contact with the GaP melt 3. Thereafter, the pulling shaft 5 was driven to perform a pulling operation at a pulling velocity of 13.7 mm/h and a temperature drop rate of 0.3° C./min to prepare the shoulder part having a diameter of 52 mm. The weight per unit length of the GaP crystal thus manufactured was compared with the voltage output from the reference weight signal generator 12 corresponding to a preset reference weight of 8.9 g/mm. The weight deviation e thus obtained was detected by the weight deviation detector 13 and a corresponding signal was output therefrom. The signal corresponding to the weight deviation e was differentiated by the first differentiation circuit 14 having a time constant of 60 seconds, for example, and the differentiated signal was compared with the buoyancy correction signal generator 15 in order to compensate for the adverse effects of the buoyancy of the liquid encapsulant 4. The corrected signal was then differentiated by the second differentiation circuit 16 having a time constant of 60 seconds, for example. The differentiated signal was added to the corrected signal. The output signal obtained by this addition was phase-compensated by the phase compensating circuit 17 having a time constant of 20 seconds, for example. In response to the phase-compensated signal, the program signal generator 19, the heating control circuit 18, and the heating device 20 operated to control the heating operation of the heater 8. The effects obtainable by phase compensation of the heating control signal in the embodiment described above are apparent in FIG. 4. The intrinsic thermal response of the GaP melt is indicated by curve A. When temperature control was performed by the heating control signal which was not subjected to phase compensation, the thermal response was improved as indicated by curve B. When the phase compensation of the heating control signal was performed, the thermal response of the melt was significantly improved as indicated by curve C. In this manner, in this example, the crystal weight detected during the pulling of the GaP crystal was compared with the reference weight. The weight deviation thus obtained was fed back through the heating control circuit system to control the heater 8, and 500 g of a GaP single crystal having an index of plane of (100) and a diameter of 52 mm were obtained with a diameter control precision of ±1%.

Another embodiment of the present invention will now be described with reference to FIG. 5. The same reference numerals as in FIG. 1 denote the same parts, and the description thereof will be omitted.

Figure 5:
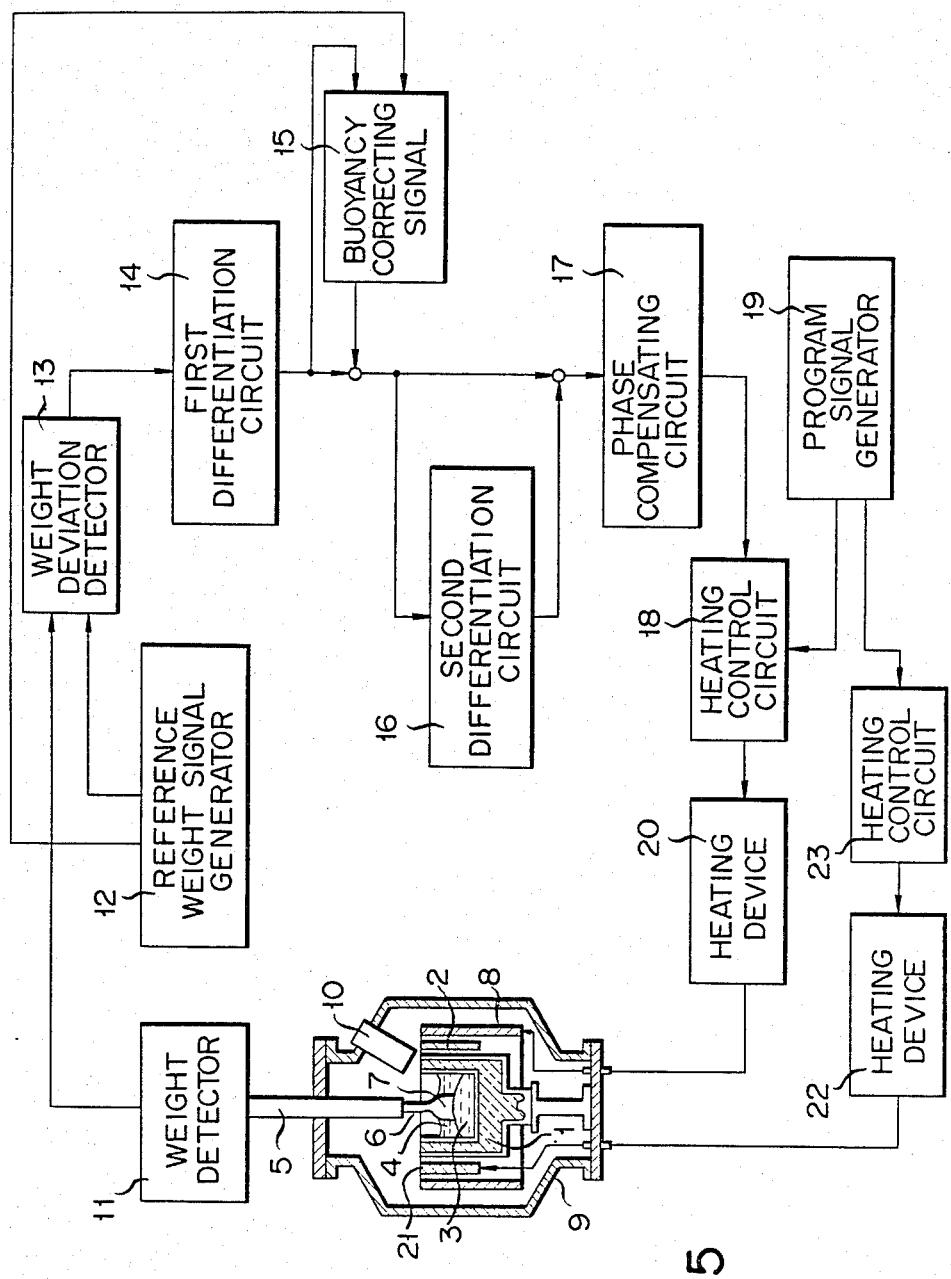
FIGS. 5 and 6 are schematic sectional views of apparatuses according other embodiments of the present invention, and block diagrams of control sections.

In the embodiment shown in FIG. 5, an auxiliary heater 21 is interposed between the crucible 2 and the heater 8, and an auxiliary heating device 22 is connected to this auxiliary heater 21. The auxiliary heating device 22 is connected to an auxiliary heating control circuit 23, the heating control operation of which is performed according to a program command supplied by the program signal generator 19. By incorporating the auxiliary heater 21 to control the heating temperature of the melt more finely, the diameter of the single crystals may be made uniform with better precision.

A still further embodiment of the present invention will now be described with reference to FIG. 6.

In this embodiment, the first and second differentiation circuits 14 and 16, the reference diameter signal generator 15, and the phase compensating circuit 17 in the control system of the circuit configuration in FIG. 1 are replaced by a computer to obtain the same heating control signal. The weight deviation output from the weight deviation detector 13 is input to an A-D converter 24 for A-D conversion. The A-D converted weight deviation signal is input to a computer 25 which produces a heating control signal which is the same as that obtainable with the apparatuses shown in FIGS. 1 and 5. The heating control signal thus obtained is D-A converted by a D-A converter 26 and then drives the heating device 20 through the heating control circuit 18. As a result, the heater 8 is heated at a predetermined temperature in response to the output from the heating device 20.

Figure 6:
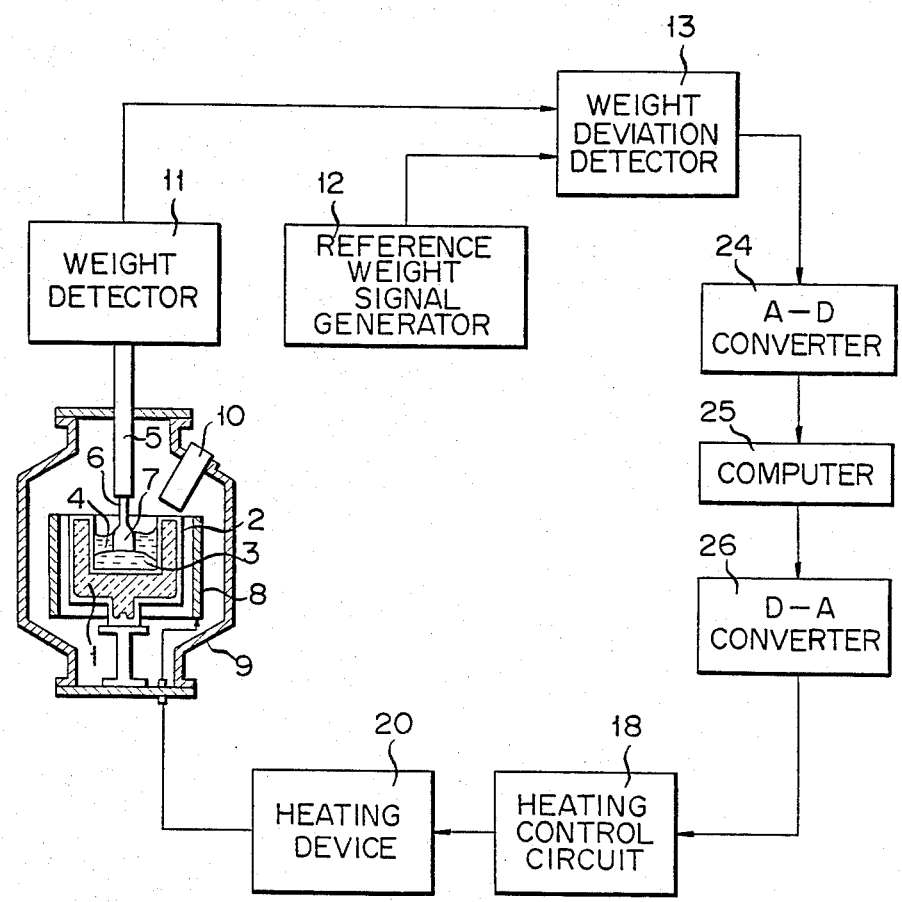

In the embodiment shown in FIG. 6, the same reference numerals in FIG. 1 denote the same parts, and the description thereof will be omitted.

Figure 7:
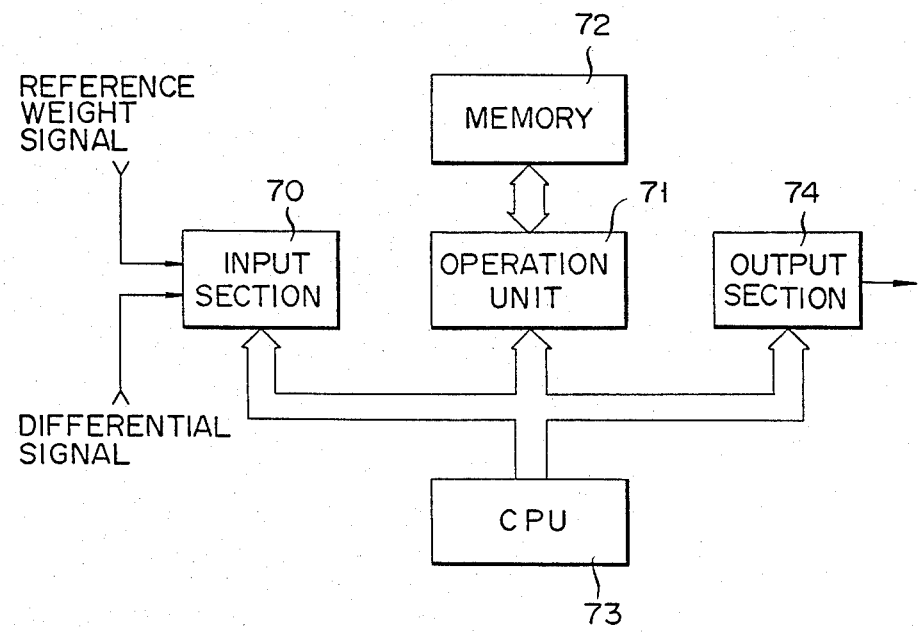
FIG. 7 is a view showing the configuration of the buoyancy correction signal generator shown in FIGS. 1 and 5.

The buoyancy correction signal generator 15 for correction of the buoyancy of the liquid encapsulant shown in FIGS. 1 and 5 has the circuit configuration as shown in FIG. 7.

An input section 70 comprises, for example, an A/D converter and receives the reference weight signal from the reference signal generator 12 and the differentiation signal from the first differentiation circuit 14. The input section 70 outputs a digital signal to an operation unit 71. A memory 72 stores in advance, the diameter of the crucible, the initial height of the liquid encapsulant the buoyancy correction coefficient and so on as constants. In response to a command from a CPU 73, the operation unit 71 receives the digital signal from the input section 70 and a signal from the memory 72 corresponding to the buoyancy correction coefficient. The operation unit 71 performs operations of equations (1), (2) and (3) for compensation for the buoyancy. An output section 74 which comprises, for example, a D/A converter generates the buoyancy correction signal as an analog signal.

The method and apparatus of the present invention are not limited to the particular embodiments described above, and various changes and modifications may be made within the spirit and scope of the present invention.

What we claim is:

1. A method for manufacturing single crystals comprising:
   a first step of pulling a single crystal from a melt within a vessel holding a melt and a liquid encapsulant;
   a second step of measuring a weight of the single crystal pulled in said first step;
   a third step of comparing a weight signal obtained in said second step with a reference weight signal to provide a weight deviation signal;
   a fourth step of differentiating the weight deviation signal obtained in said third step;
   a fifth step of converting a buoyancy of said liquid encapsulant influencing the single crystal pulling into a weight/time signal corresponding thereto and outputting the weight/time signal as a buoyancy correction signal;
   a sixth step of subtracting the buoyancy correction signal obtained in said fifth step from a differentiation output signal obtained in said fourth step to provide a signal corresponding to a true diameter fluctuation of the single crystal;
   a seventh step of differentiating the signal obtained in said sixth step;
   an eighth step of adding a differentiation output signal obtained in said seventh step and the signal obtained in said sixth step;
   a ninth step of generating a heating control signal for the melt in response to the signal obtained in said eighth step; and a tenth step of heating the solution in response to the heating control signal obtained in said ninth step.

2. The method according to claim 1, wherein said tenth step comprises a first heating step of heating the melt in response to the heating control signal; and a second heating step of supplementarily heating the melt in response to a heating control signal from a separate heating device.

3. A method for maufacturing single crystals comprising:
- a first step of pulling a single crystal from a melt within a vessel holding a melt and a liquid encapsulant;
- a second step of measuring a weight of the single crystal pulled in said first step;
- a third step of comparing a weight signal obtained in said second step with a reference weight signal to provide a weight deviation signal;
- a fourth step of differentiating the weight deviation signal obtained in said third step;
- a fifth step of converting a buoyancy of said liquid encapsulant influencing the single crystal pulled into a weight/time signal corresponding thereto and outputting the weight/time signal as a buoyancy correction signal;
- a sixth step of subtracting the buoyancy correction signal obtained in said fifth step from a differentiation output signal obtained in said fourth step to provide a signal corresponding to a true diameter fluctuation of the single crystal;
- a seventh step of differentiating the signal obtained in said sixth step;
- an eighth step of adding a differentiation output signal obtained in said seventh step and the signal obtained in said sixth step;
- a ninth step of phase-compensating a signal obtained in said eighth step to provide a phase-compensated signal to make a thermal response of the melt early;
- a tenth step of generating a heating control signal for the melt in response to the phase-compensated signal obtained in said ninth step; and
- an eleventh step of heating the solution in response to the heating control signal obtained in said tenth step.

4. A method according to claim 3, wherein said eleventh step comprises a first heating step of heating the melt in response to the heating control signal; and a second heating step of supplementarily heating the melt in response to a heating control signal from a separate heating device.

* * * * *